United States Patent [19]  [11] 4,309,813
Hull  [45] Jan. 12, 1982

[54] MASK ALIGNMENT SCHEME FOR LATERALLY AND TOTALLY DIELECTRICALLY ISOLATED INTEGRATED CIRCUITS

[75] Inventor: Richard Hull, Palm Bay, Fla.
[73] Assignee: Harris Corporation, Melbourne, Fla.
[21] Appl. No.: 212,799
[22] Filed: Dec. 4, 1980

Related U.S. Application Data

[63] Continuation of Ser. No. 107,118, Dec. 26, 1979, abandoned.

[51] Int. Cl.³ .................. G03F 9/00; H01L 21/308
[52] U.S. Cl. .................. 29/580; 156/647; 156/657; 156/659.1; 356/401; 430/22
[58] Field of Search .......... 156/647, 648, 657, 662, 156/659.1; 29/580; 430/22; 356/401

[56] References Cited

U.S. PATENT DOCUMENTS

| | | | |
|---|---|---|---|
| 3,544,801 | 12/1970 | Dyck | 356/400 |
| 3,617,267 | 11/1971 | Kinney | 430/22 |
| 3,623,218 | 11/1971 | Mitari et al. | 156/647 |
| 3,739,247 | 3/1973 | Yamaguchi et al. | 356/400 |
| 3,752,589 | 8/1973 | Kobayashi | 356/172 |
| 3,796,497 | 3/1974 | Mathisen et al. | 356/172 |
| 3,844,858 | 10/1974 | Bean | 156/647 |
| 3,861,798 | 1/1975 | Kobayashi et al. | 356/172 |
| 3,963,489 | 6/1976 | Cho | 430/22 |
| 3,998,673 | 12/1976 | Chow | 156/662 |
| 4,015,034 | 3/1977 | Smolen | 430/22 |
| 4,050,979 | 9/1977 | Smeltzer et al. | 156/647 |
| 4,052,603 | 10/1977 | Karlson | 364/120 |
| 4,070,117 | 1/1978 | Johannsmeier et al. | 356/172 |
| 4,153,371 | 5/1979 | Koizumi et al. | 356/400 |
| 4,233,091 | 11/1980 | Kawabe | |
| 4,251,160 | 2/1981 | Bouhuis et al. | 356/401 |

*Primary Examiner*—Jerome W. Massie
*Attorney, Agent, or Firm*—Leitner, Palan, Martin & Bernstein

[57] ABSTRACT

A support material rectangle indicia is formed during the formation of the dielectrical isolation of starting material islands in one of said dielectrically isolated islands. An X indicia on a mask is positioned over the four corners of rectangular indicia to align the mask and the substrate.

11 Claims, 13 Drawing Figures

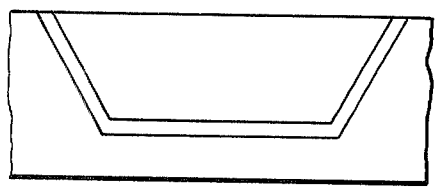
FIG. 1A
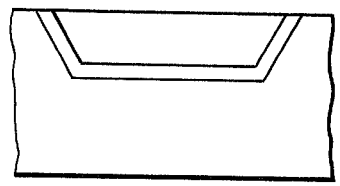
FIG. 1B
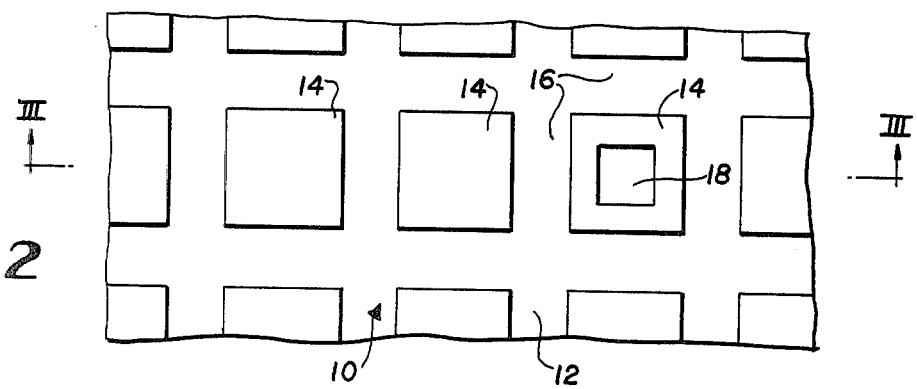
FIG. 2
FIG. 3
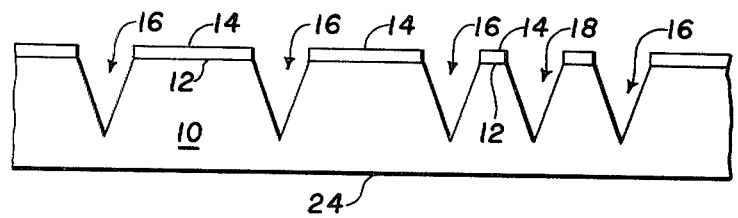
FIG. 4
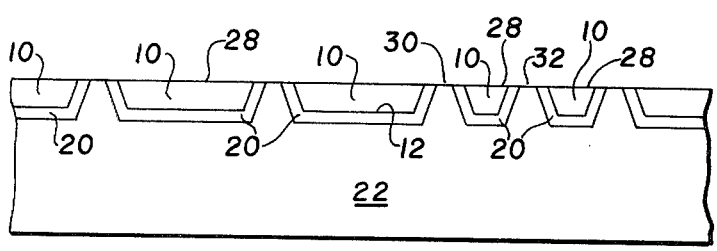
FIG. 5

MASK ALIGNMENT SCHEME FOR LATERALLY AND TOTALLY DIELECTRICALLY ISOLATED INTEGRATED CIRCUITS

This is a continuation of application Ser. No. 107,118, filed Dec. 26, 1979, now abandoned.

BACKGROUND OF THE INVENTION

The present invention relates generally to mask alignment schemes, and more specifically to a mask alignment scheme for forming devices in laterally dielectrically isolated islands.

Devices in integrated circuits are formed by introducing inpurities into a surface of a substrate. This requires the use of a plurality of masks to form regions of different depths and impurity concentrations. Acceptability of the finally formed devices depends upon alignment of the diffused regions. Thus, there is great emphasis on schemes to align a mask to a substrate to assure proper alignment of the diffused regions. For junction isolated substrates, the first diffusion is from a top surface and consequently, all the diffusions may be aligned relative to the first diffusion. This technique may include positioning an indicia on a substrate and performing the first and subsequent diffusions using an indicia on the mask to align with the indicia on the substrate.

For devices formed in dielectrically isolated islands of the type described in U.S. Pat. No. 3,865,649, the dielectrically isolated islands are formed from a first surface which subsequently becomes a buried surface and the devices are formed therein by diffusion into a second surface opposite the first surface which does not exist in the initial material. Thus, no initial mark may be formed which allows alignment of the diffused device regions to the dielectric isolation. Since it is unacceptable for diffused regions of the device to touch the dielectric isolation, more care and time have to be used to align the mask relative to the dielectric isolation. Since the islands have inwardly sloping sides, the surface area available for forming the diffused regions is a function of the amount of starting material removed. Thus, the size of the islands as perceived from the surface varies considerably as illustrated in FIGS. 1a and 1b. At present, the diffusions are aligned to the outside of the islands. In view of the variation in the size, the alignment in a possibly increased sized island will not assure alignment in the remaining islands on the wafer. The varied island size also results in a varying alignment tolerance. This causes difficulty in judging alignment visually.

For devices formed in islands of the substrate having lateral dielectric isolation and a buried junction isolation according to U.S. Pat. No. 3,979,237, the lateral dielectric isolation is formed in the same surface as the devices. Thus, there is a capability of providing an indicia on a common surface for alignment of diffusion. But as with the completely dielectric isolated islands the size of the island as perceived from the surface varies considerably. Thus alignment relative to the lateral dielectric isolation cannot be assured even using an indicia on the same surface for the formation of the lateral isolation and the devices. Thus there exists a need for an alignment technique to be used with laterally and totally dielectrically isolated wafers which assures alignment of the device formation mask with the originally formed islands.

SUMMARY OF THE INVENTION

An object of the present invention is to provide an alignment technique which can be used in laterally and totally dielectrically isolated islands.

Another object of the present invention is to provide an improved alignment indicia between laterally or totally dielectrically isolated substrates and the subsequent masks.

A further object of the present invention is to provide an alignment indicia on a substrate which assures subsequent alignment on a first surface relative to previous processings on a second opposite surface.

A still further object is to provide an alignment scheme for laterally and totally dielectrically isolated islands which is independent of the size of the island.

These and other objects of the present invention are attained by forming a rectangular fill material indicia interior to a starting material island exposed at the first surface during the formation of the dielectric isolation of the starting material islands from the first surface for lateral dielectric isolation and from a second surface for total dielectric isolation. The indicia rectangle is formed by etching the first or second surface through a rectangular aperture to produce a convergent etching. This assures the squareness of the rectangle corners. An X indicia on the first mask whose members have the angular relationship of the diagonals of the rectangular indicia of the substrate allows alignment of the mask relative to the substrate by positioning the members of the X on the four corners of the rectangular substrate indicia. The members of the X may be formed from two spaced parallel lines and the corner of the rectangular indicia may be positioned in the space between the parallel lines.

Other objects, advantages and novel features of the present invention will become apparent from the following detailed description of the invention when considered in conjunction with the accompanying drawings.

BRIEF DESCRIPTION OF THE DRAWINGS

FIGS. 1a and 1b are cross-sectional views of islands of different depths.

FIG. 2 is a topological view of a starting material substrate with a masking layer.

FIG. 3 is a cross-sectional view taken along line III—III of FIG. 2 after etching.

FIG. 4 is a cross-sectional view of the etched starting material and support material.

FIG. 5 is a cross-sectional view of dielectrically isolated islands and indicia.

DESCRIPTION OF THE PREFERRED EMBODIMENTS

Figure 6:
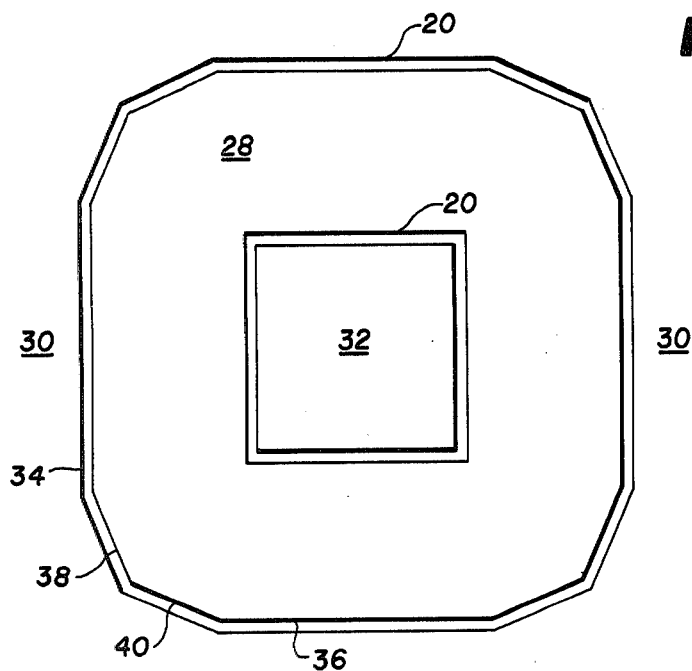
FIG. 6 is a topological view of the rectangular indicia and starting material island.

As depicted in FIG. 2, the process of the present invention begins with forming on a first surface 12 of a starting material 10 a masking layer 14. In a typical example, the starting material is an N-type wafer of single crystal silicon having a thickness of approximately 18 mils, resistivity of approximately 5 ohm-centimeters and impurity concentration of approximately $1 \times 10^{15}$ carriers per cubic centimeter. The starting material 10 is prepared or cut to have a planar surface of a crystal orientation in the [100] plane. These are but examples of the type of starting material, its depth and impurity concentration and other materials which may be used. The masking layer 14 may be an oxide layer of a thickness of approximately 6,000 angstroms grown on the surface 12. A photoresist and oxide etch procedure is used to expose surface portions 16 on surface 12 which defines the isolation regions and to expose a surface area 18 which will constitute the rectangular indicia. As is well known in this procedure, a photoresistant layer is deposited on the oxide mask; the photoresist is exposed to light in accordance with the desired pattern; then the pattern is developed to remove unexposed portions of the photoresist; and the exposed portions of the oxide layer is removed with a suitable etchant. This results in the mask illustrated in FIG. 2.

A moat etch is performed to provide V-shaped moats in exposed areas 16 and a pyramid aperture in surface 18. The resulting structure is illustrated in FIG. 3. The oxide mask 14 is then removed and the exposed surfaces are cleaned. The wafer 10 with the moats and pyramid aperture therein is subjected to a thermal oxidation for a period sufficient to form a 10,000 angstrom layer of oxide along top surface 12 and along the face of the moats and aperture. A polycrystalline support material, for example silicon, is deposited on the oxide 20 to over-fill the moat and form the support structure 22 as illustrated in FIG. 4. The second surface 24 opposite the first surface is lapped and polished until the polishing plane intersects the etched isolation patterns and the pyramid. The starting material 10 is removed down to the dashed line 26 illustrated in FIG. 4.

The wafer is inverted, as illustrated in FIG. 5, to have a top surface including a plurality of starting material surface regions 28 separated from each other by surface areas 30 of the support material 22. One of the starting material islands 28 includes a rectangular indicia surface area 32 of support material 22 in the pyramid aperture.

Figure 7:
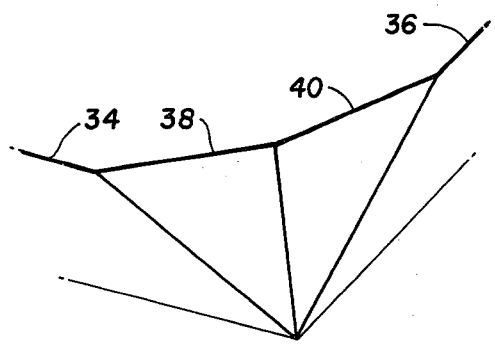
FIG. 7 is a perspective view of the intersection of orthogonal etched moats.

An enlarged view of the island including the rectangular indicia is illustrated in FIG. 6. As is noted from the view of FIG. 6, the outside edges of the starting material island 28 are substantially rounded off. More specifically, orthogonal edges 34 and 36 do not meet at a right angle, but are connected by angular segments 38 and 40. This results from the anisotropic etch of the starting material 10. In the etching of the exposed areas 16 from FIG. 2, the etchant dissolves material along the [1-1-1] plane to form the sloped edges. At the intersection of orthogonal moat patterns, the etching planes diverge which cause the etching along line 36 of FIG. 6 to etch the exposed edge of line 34 and produce the etch line 38 while the etching along line 34 of FIG. 6 etch the exposed edge of line 36 and produces the etched portion 40. The amount of rounding or the size of segments 38 and 40 is a function of the depth of the islands. As illustrated in FIG. 7, the etched surfaces 38 and 40 are triagular and thus diminish with the depth of the island.

It should be noted that this rounding or side etching along the exterior of the island 28 is not produced on the interior convergent edges of surface 18 of FIG. 2. This results because the edges of the orthogonal etching plane are not exposed to the etchant since they are converging versus diverging etch planes of the corners of the exterior moat pattern. Thus, the rectangular indicia pattern 32 has square corners whereas the island 28 has a generally rectangular shape with rounded corners.

The size of indicia 32 varies as does the size of the island 28 depending upon the depth of the original islands. Although this is true, the only variable that can be assured is that the indicia 32 is a rectangle having square corners whereas the corners of the rectangular island 28 may be generally rounded. Consequently, the mask to substrate alignment scheme is designed for the corners of the rectangle 32.

Figure 8:
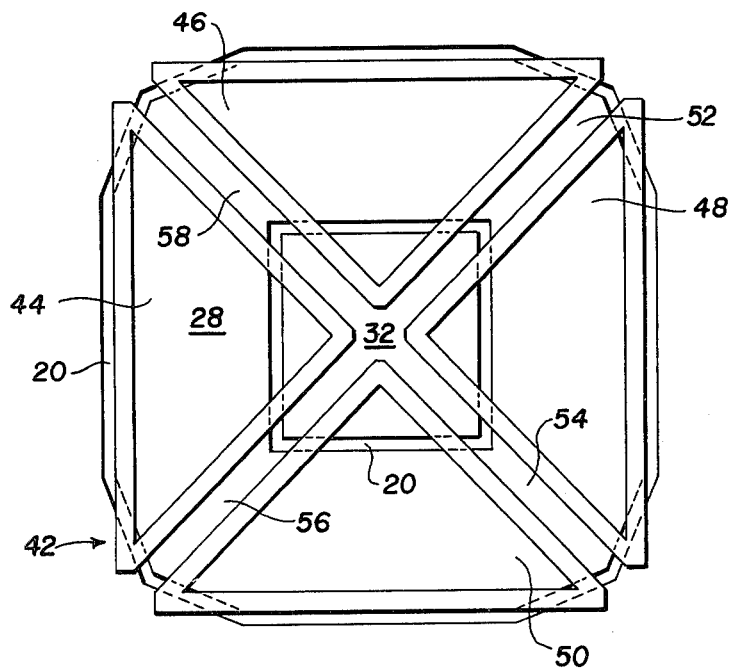
FIG. 8 is a topological view of the X indicia aligned on the rectangular indicia.

As illustrated in FIG. 8, an indicia 42 is provided on the mask having a general X pattern. This X pattern is formed by the area between the plurality of adjacent sides of four orthogonally positioned triangles 44, 46, 48 and 50 with adjacent apex. The four members or legs of the X pattern 52, 54, 56, and 58 are formed having the angular relationship of the diagonals of the rectangle 32. By aligning the members of the X pattern over the four corners of the rectangular indicia 32, the mask and substrate are aligned in the X and Y direction.

Thus, a masking technique has been provided which does not require square corners on the starting material islands 28 and has a rectangle indicia 32 which is formed during the formation of the moat regions in the starting materials. Consequently, an alignment for subsequent diffusion on a first surface relative to initial processing on a second surface is provided.

Figure 9:
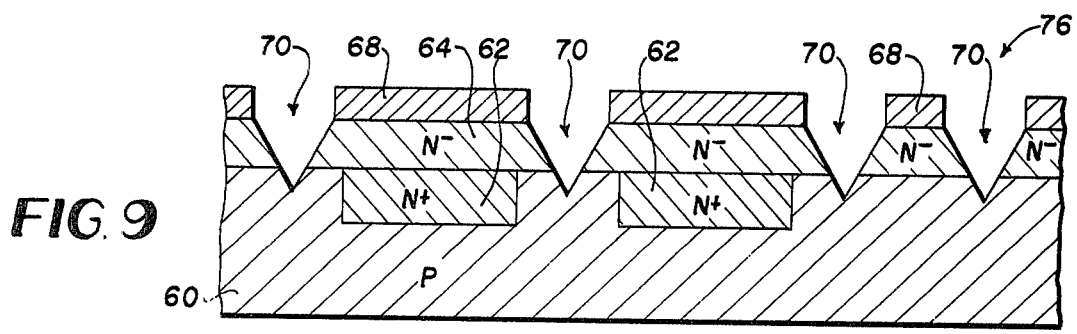
FIGS. 9–11 are cross-sectional views of a wafer at various stages of fabrication to form lateral dielectrically isolated islands including indicia according to the principle of the present invention.

As previously indicated, the concept of the present invention including converging etching to form a rectangular indicia to be used with an X for mask to substrate alignment may also be used for substrates having lateral dielectric isolation and a buried junction isolation as illustrated in U.S. Pat. No. 3,979,237 which is incorporated herein by reference. The modification of this proces is illustrated in FIGS. 9 through 12. A substrate 60 of, for example, a P-type single crystal silicon has a plurality of heavily doped $N^{30}$ regions 62 formed in a surface thereof. A lightly doped N epitaxial layer 64 is then formed over the substrate 60. A thin film 68 of sufficient hardness to withstand normal polishing of the slice is deposited on the exposed surface of the epitaxial layer 64. An isolation pattern is defined in the hard film 68 by photoresist operation. After providing the holes in the film 68, isolation grooves 70 are etched through epitaxial layer 64 and into substrate 60. The resulting structure is illustrated in FIG. 9.

Figure 10:
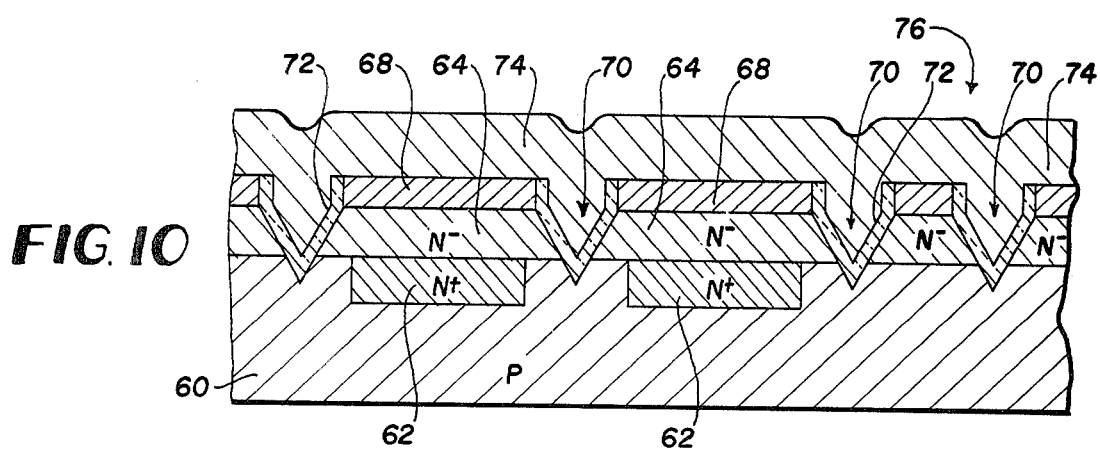
Figure 11:
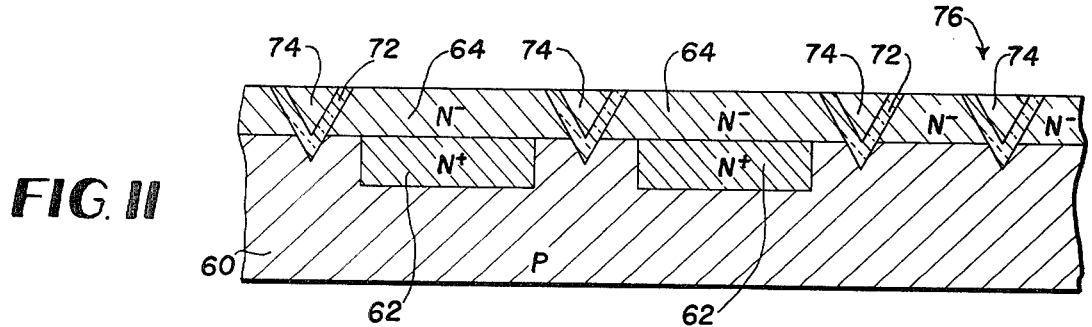

A thin insulative layer 72 is formed on the surface of the grooves 70. The remainder of the grooves are then filled with a suitable material 74 for example polycrystalline silicon. The structure at this point is illustrated in FIG. 10. The excess polycrystalline material 74 and any insulative layer 72 that may have been formed on a planar surface of the thin hard film 68 is polished away by conventional machine polishing of the slice. This is followed by etching away the polishing stop film 68. This results in the structure of FIGS. 11 and 12 wherein the $N^-$ epitaxial layer 64 is divided into a plurality of segments surrounded laterally by a moat having an insulative layer 72 and polycrystalline fill 74.

Figure 12:
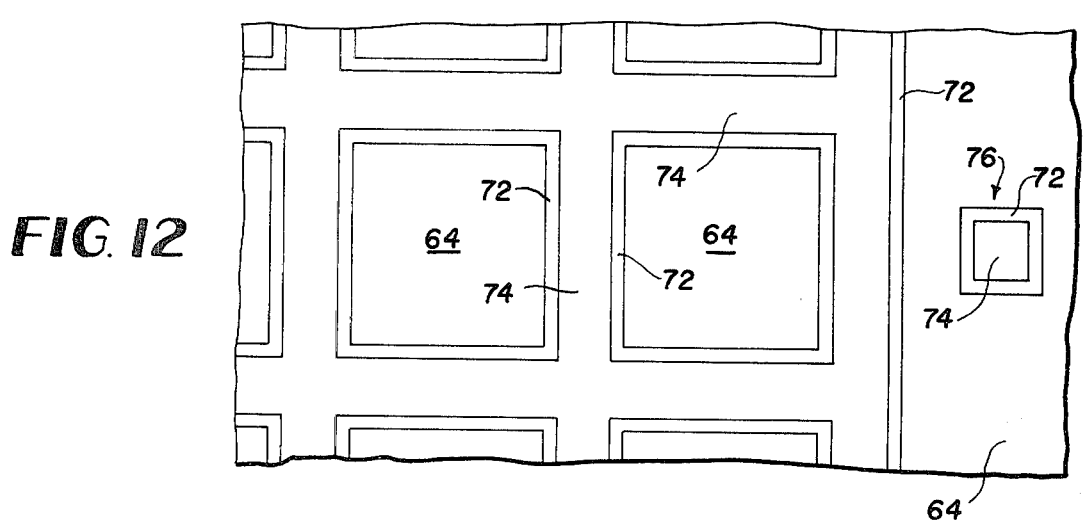
FIG. 12 is a topological view of FIG. 11.

The process described so far is identical to that of U.S. Pat. No. 3,979,237. As in the previous example of the completely dielectrically isolated island of FIGS. 2 through 8, the moat regions produce $N^-$ epitaxial region 64 having rounded edges, because of the divergent etching at the corners. Thus these moat regions may not provide sufficient squareness to be used as the substrate indicia of a mask alignment technique. Thus, to incorporate the principles of the present invention, a diverging etch is needed to produce the square indicia. The modification of the process as illustrated in FIGS. 9 through 12 includes a square mask pattern 76 such that only converging etching occurs. As discussed previously, this assures the squareness of the corners. The resulting substrate indicia is illustrated in FIG. 12 as 76 having a rectangular polycrystalline filled area 74 enclosed by a dielectric layer 72 formed in the epitaxial layer 64.

Although the rectangle 32 is illustrated as a square, obviously other rectangles may be used. The X pattern will assume the appropriate angular relationship corresponding to the diagonals of whatever rectangular pattern or shape is chosen for the rectangular indicia 32.

Although the present alignment scheme was described as having a rectangle indicia on one element to be aligned with the X pattern with the other element wherein the X aligns along diagonals of the rectangle has been shown for dielectrically isolated islands with the rectangle indicia on the substrate and the X indicia on the mask, this scheme may be used to align any two other elements.

From the preceding description of the preferred embodiments, it is evident that the objects of the invention are attained and although the invention has been described and illustrated in detail, it is to be clearly understood that the same is by way of illustration and example only and is not to be taken by way of limitation. The spirit and scope of this invention are limited only by the terms of the appended claims.

What is claimed:

1. A method of aligning mask to a substrate comprising:
    forming a rectangular indicia on said substrate and an X indicia on said mask whose legs represent the angular relationship of the diagonals of said rectangle; and
    adjusting the position of said mask and substrate relative to each other until the legs of said X intersect the four corners of said rectangle.

2. The method according to claim 1 wherein each leg of said X is formed by two spaced parallel lines and said adjusting step positions said corners of said rectangle in the space between said parallel lines.

3. In a process for fabricating dielectrically isolated islands on a substrate including masking a first surface of a starting material to expose moat areas, etching said exposed areas to form said islands of starting material an insulating layer on the surface of said starting material and moats, overfilling said moats with a support material, removing portions of said starting material from a second surface opposite said first surface sufficiently to expose said support material at a new second surface, and forming devices in the new second surface of said starting material, the improvement comprising a mask alignment indicia formed and aligned by:
    forming a rectangular aperture in said mask to expose an indicia area on said first surface of said starting material;
    etching said exposed indicia area to form an indicia hole;
    overfilling said indicia hole with said support material;
    removing said starting material from said second surface sufficiently to expose a rectangle of said support material of said indicia hole at said new second surface;
    forming an X indicia on a mask used to form said devices in said second surface, the legs of said X represent the diagonals of said rectangle; and
    aligning said mask and said substrate by positioning the legs of said X on the four corners of said rectangle.

4. The process according to claim 3 wherein said aperture is square and said resulting exposed support material of said indicia hole is square.

5. The process according to claim 4 wherein said starting material has a crystal orientation resulting in an anisotropic etch.

6. The process according to claim 3 wherein said X is formed from the area between adjacent sides of four orthogonally aligned triangles with adjacent apex.

7. The process according to claim 6 wherein said aligning positions the four corners in the area between the sides of said triangles.

8. In a process for fabricating laterally dielectrically isolated islands in a first layer on a substrate including masking a first surface of said first layer to expose moat areas, etching said exposed areas to form said islands of said first layer, forming an insulating layer on the surface of said moats, overfilling said moats with fill material, removing said fill material down to the surface of said first layer and forming devices in the surface of said first layer, the improvement comprising a masking alignment indicia formed and aligned by:
    forming a rectangular aperture in said mask to expose an indicia area on said first surface of said first layer;
    etching said exposed indicia area to form an indicia hole;
    overfilling said indicia hole with said fill material;
    removing said fill material down to said surface of said first layer to form a rectangular fill material indicia in the surface of said first layer;
    forming an X indicia on a mask used to form said devices in said second surface, the legs of said X represent the diagonals of said rectangle; and
    aligning said mask and said substrate by positioning the legs of said X on the four corners of said rectangle.

9. The process according to claim 8 wherein said aperture is square and said resulting indicia is square.

10. The process according to claim 9 wherein said starting material has a crystal orientation resulting in an anisotropic etch.

11. The process according to claim 8 wherein each leg of said X indicia is formed by two spaced parallel lines and said aligning step positions said corners of said rectangle in the space between said parallel lines.

* * * * *

UNITED STATES PATENT AND TRADEMARK OFFICE
CERTIFICATE OF CORRECTION

PATENT NO. : 4,309,813
DATED : Jan. 12, 1982
INVENTOR(S) : Richard Hull

It is certified that error appears in the above—identified patent and that said Letters Patent is hereby corrected as shown below:

Column 3

Line 12, delete "ang stroms" and insert --angstroms--

Line 64, delete "triagular" and insert --triangular--

Column 4

Line 38, delete "proces" and insert --process--

Line 40, delete "$N^{30}$" and insert --$N^+$--

Line 67, delete "edges," and insert --edges--

Signed and Sealed this

Eleventh Day of May 1982

[SEAL]

Attest:

GERALD J. MOSSINGHOFF

Attesting Officer    Commissioner of Patents and Trademarks